US006538872B1

(12) United States Patent
Wang et al.

(10) Patent No.: US 6,538,872 B1
(45) Date of Patent: *Mar. 25, 2003

(54) ELECTROSTATIC CHUCK HAVING HEATER AND METHOD

(75) Inventors: You Wang, Cupertino; Shamouil Shamouilian, San Jose; Arnold Kholodenko, San Francisco; Alexander M. Veytser, Mountain View; Surinder S. Bedi, Fremont; Kadthala R. Narendrnath, San Jose; Semyon L. Kats, San Francisco, all of CA (US); Dennis S. Grimard, Ann Arbor, MI (US); Wing L. Cheng, Sunnyvale; Ananda H. Kumar, Milpitas, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 16 days.

(21) Appl. No.: 09/307,214

(22) Filed: Nov. 5, 2001

(51) Int. Cl.[7] .............................................. H01G 23/00
(52) U.S. Cl. ...................... 361/234; 361/115; 361/103
(58) Field of Search ................................. 361/234, 115, 361/103; 279/128; 438/16

(56) References Cited

U.S. PATENT DOCUMENTS

| 4,645,218 A | 2/1987 | Ooshio et al. ............. 279/1 M |
| 5,155,652 A | 10/1992 | Logan et al. ............... 361/234 |
| 5,191,506 A | 3/1993 | Logan et al. ............... 361/234 |
| 5,280,156 A | 1/1994 | Niori et al. .................. 219/385 |
| 5,376,213 A | 12/1994 | Ueda et al. ................. 156/345 |
| 5,460,684 A | 10/1995 | Saeki et al. |
| 5,478,429 A | 12/1995 | Komino et al. ............. 156/345 |
| 5,527,584 A | 6/1996 | Darfler et al. |
| 5,529,657 A | 6/1996 | Ishii ........................... 156/345 |
| 5,581,874 A | 12/1996 | Aoki et al. .................... 29/825 |
| 5,600,530 A | 2/1997 | Smith .......................... 361/234 |
| 5,606,484 A | 2/1997 | Kawada et al. ............. 361/234 |
| 5,625,526 A | 4/1997 | Watanabe et al. ........... 361/234 |
| 5,665,260 A | 9/1997 | Kawada et al. |
| 5,671,116 A | 9/1997 | Husain ........................ 361/234 |
| 5,737,178 A | 4/1998 | Herchen ...................... 361/234 |
| 5,745,331 A | 4/1998 | Shamouilian et al. ....... 361/234 |
| 5,818,693 A | 10/1998 | Garner et al. |
| 5,827,585 A | 10/1998 | Giannetti |
| 5,858,100 A * | 1/1999 | Maeda et al. ............... 118/719 |
| 5,886,863 A | 3/1999 | Nagasaki et al. |
| 5,886,864 A | 3/1999 | Dvorsky |
| 5,949,650 A | 9/1999 | Bulante et al. |
| 5,958,813 A * | 9/1999 | Aida et al. .................. 501/98.4 |
| 5,968,747 A * | 11/1999 | Moran .......................... 356/72 |
| 5,978,202 A | 11/1999 | Wadensweiler et al. |
| 6,048,434 A | 4/2000 | Tamura et al. |
| 6,072,685 A | 6/2000 | Herchen |
| 6,094,334 A * | 7/2000 | Bedi et al. ................... 361/234 |

FOREIGN PATENT DOCUMENTS

| EP | 0123456 A2 * | 1/2000 | ................. 100/100 |
| JP | 4-238882 * | 8/1992 | |
| JP | 9-45757 | 2/1997 | |
| JP | 410270540 A * | 10/1998 | |
| JP | 11-163109 A | 6/1999 | |
| JP | 411176919 A * | 7/1999 | |

OTHER PUBLICATIONS

IBM Technical Disclosure Bulletin, vol. 31, No. 1, Jun. 1988, pp. 462–464.

* cited by examiner

Primary Examiner—Stephen W. Jackson
Assistant Examiner—Sharon Polk
(74) Attorney, Agent, or Firm—Ashok Janah; Joseph Bach

(57) ABSTRACT

An electrostatic chuck 55 for holding a substrate 30 comprises an electrostatic member 100 made from a dielectric 115 covering an electrode 105 that is chargeable to electrostatically hold the substrate 30. A base 175 that includes a heater 235 is joined to the electrostatic member 100. The base may be made from a composite material, such as a porous ceramic infiltrated with the metal, and may be joined to the electrostatic member by a bond layer.

18 Claims, 6 Drawing Sheets

ELECTROSTATIC CHUCK HAVING HEATER AND METHOD

BACKGROUND

The present invention relates to an electrostatic chuck for holding a substrate in a chamber.

Electrostatic chucks, which use electrostatic attraction forces to hold a substrate, have several advantages over mechanical and vacuum chucks. For example, electrostatic chucks reduce stress-induced cracks caused by mechanical clamps, allow processing of a larger portion of the substrate, and can be used in processes conducted at low pressures. A typical electrostatic chuck comprises an electrode covered by a dielectric. When the electrode is electrically charged, an opposing electrostatic charge accumulates in the substrate and the resultant electrostatic force holds the substrate onto the electrostatic chuck. Once the substrate is firmly held on the chuck, a plasma of gas is used to process the substrate.

Certain newly developed plasma processes for the fabrication of integrated circuits are often performed at high temperatures and in highly erosive gases. For example, processes for etching copper or platinum are conducted at temperatures of from 250 to 600° C., compared to temperatures of 100 to 200° C. for etching aluminum. The high temperatures and erosive gases thermally degrade the materials used to fabricate the chucks. The high temperature requirement is met by ceramic materials, such as aluminum oxide ($Al_2O_3$) or aluminum nitride (AlN). However, it is difficult to attach the ceramic chuck to chamber components which are typically made from metal because the difference in thermal expansion coefficients of the ceramic and metal can result in thermal and mechanical stresses that can cause the ceramic to fracture or chip. It is desirable to have a system for fastening a ceramic chuck to a chamber without causing excessive thermal stresses between the chuck and the chamber.

In addition, the newly developed processes often require the substrate on the electrostatic chuck to be heated to temperatures higher than those provided by the heat load of the plasma. The high temperatures can be obtained by using a heater, for example, the substrate can be heated by infrared radiation from heat lamps provided outside the chamber. However, it is difficult to pass infrared radiation through the aluminum oxide or metal walls of the chamber. In another approach, as described in U.S. Pat. No. 5,280,156, the electrostatic chuck comprises a ceramic dielectric having both the electrode and the heater embedded therein. However, operating the embedded heater at high power levels can cause the ceramic dielectric covering the electrode to microcrack from the thermal stresses generated by differences in thermal expansion between the ceramic, electrode, and heater. Thus, there is a need for an electrostatic chuck that can be heated to high temperatures without damaging the chuck.

In certain processes, it is also desirable to rapidly cool the substrate in order to maintain the substrate in a narrow range of temperatures, especially for etching interconnect lines that have very small dimensions and are positioned close together. However, temperature fluctuations occur in high power plasmas due to variations in the coupling of RF energy and plasma ion densities across the substrate. These temperature fluctuations can cause rapid increases or decreases in the temperature of the substrate. Also, variations in heat transfer rates between the substrate and chuck can arise from the non-uniform thermal impedances of the interfaces between the substrate, chuck, and chamber. Thus, it is desirable to have an electrostatic chuck that can rapidly cool the substrate to more closely control the temperature of the substrate.

Another problem that frequently arises with conventional electrostatic chucks is the difficulty in forming a secure electrical connection between the electrode of the electrostatic chuck and an electrical connector that conducts a voltage to the electrode from a terminal in the chamber. Conventional electrical connectors have spring biased contacts which can oxidize and form poor electrical connections to the electrode. Moreover, electrical connections formed by soldering or brazing the electrical connector to the electrode often result in weak joints that can break from thermal or mechanical stresses. Thus, it is desirable to have an electrostatic chuck with a secure and reliable electrical connection between the electrode and electrical connector.

Yet another problem frequently arises from the vacuum seal between the electrostatic chuck and the surface of the chamber, especially for high temperature processes. Typically, fluid, gas, and electrical lines extend to the electrostatic chuck through vacuum sealed feedthroughs in the chamber. In conventional chambers, the feedthroughs are vacuum sealed by polymer O-rings that are positioned in grooves extending around their circumference. However, the polymer O-rings often lose their compliance and resilience at high temperatures making it difficult to maintain the integrity of the vacuum seal.

Accordingly, there is a need for an electrostatic chuck that can be operated at high temperatures without excessive thermal or mechanical degradation. There is also a need for an electrostatic chuck that can heat the substrate to higher temperatures than those provided by the heat load of the plasma. There is also a need for an electrostatic chuck having a uniform and low thermal impedance to transfer heat to and from the substrate to allow rapidly heating or cooling of the substrate. There is a further need for an electrostatic chuck having a secure and reliable connection between its electrode and electrical connector. There is also a need for degradation resistant vacuum seal between the electrostatic chuck and chamber.

SUMMARY

The present invention relates to an electrostatic chuck for holding a substrate that satisfies these needs. In one embodiment, the electrostatic chuck comprises an electrostatic member comprising a dielectric covering an electrode that is chargeable to electrostatically hold the substrate. A base below the electrostatic member comprises a heater. Preferably, the base comprises a composite of a plurality of materials.

The present invention further teaches a method for fabricating an electrostatic chuck for holding a substrate. The method comprises the steps of: forming an electrostatic member comprising a dielectric covering an electrode that is chargeable to electrostatically hold the substrate, and forming a base comprising a heater, the base having a surface that can be joined to the electrostatic member.

DRAWINGS

These features, aspects, and advantages of the present invention will become better understood with regard to the following description, appended claims, and accompanying drawings which illustrate examples of the invention, where:

DESCRIPTION

Figure 1:
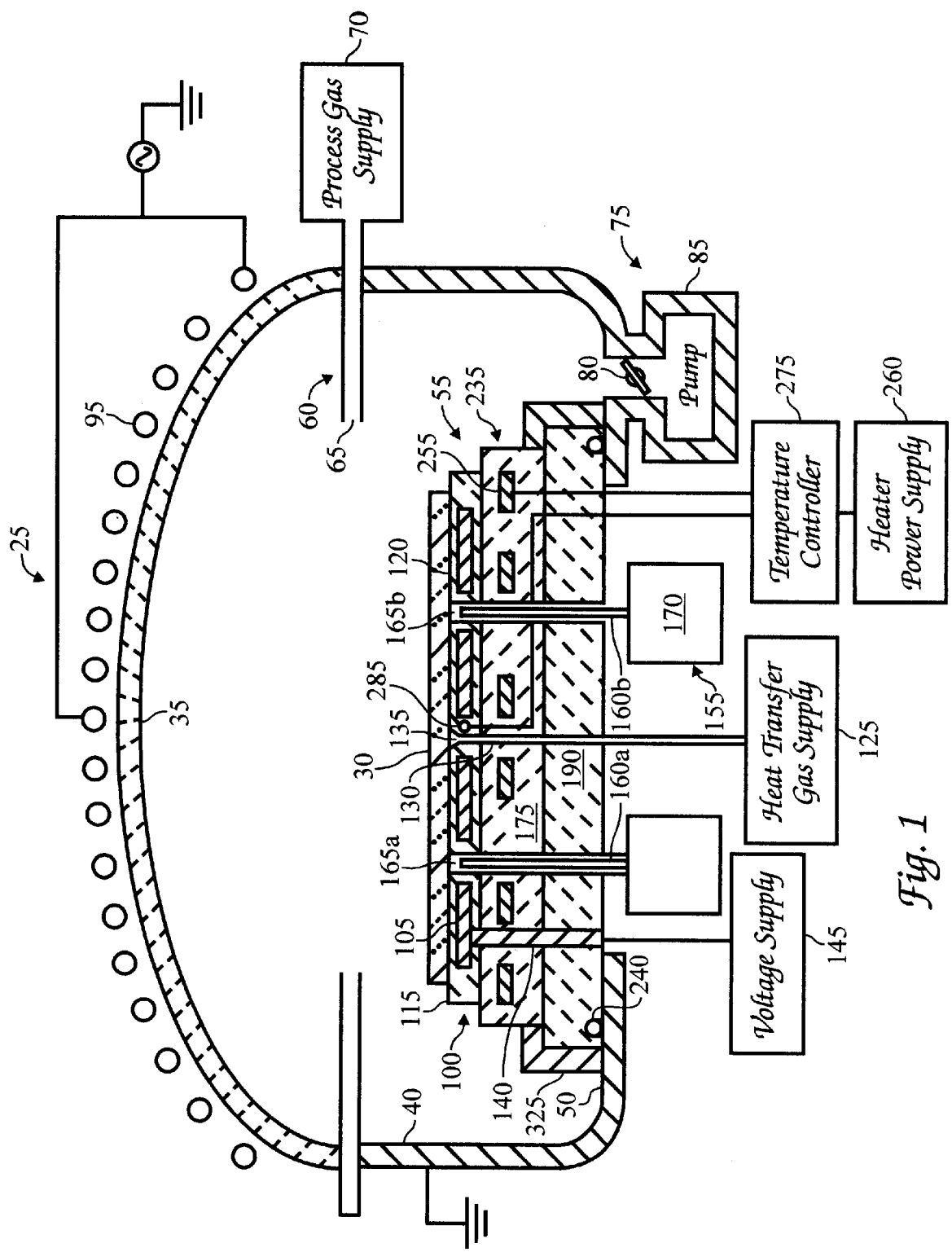
FIG. 1 is a schematic sectional side view of a chamber showing an electrostatic chuck according to the present invention.

An exemplary chamber 25 for processing a substrate 30, such as a semiconductor wafer, is illustrated in FIG. 1. The chamber 25 comprises a ceiling 35, sidewalls 40, and a lower surface 50 on which rests an electrostatic chuck 55 that is used to securely hold the substrate 30 during processing. The chamber 25 further comprises a process gas distributor 60 having one or more holes 65 for introducing process gas from a process gas supply 70 into the chamber 25. An exhaust system 75 is used to exhaust spent gas and gaseous byproducts from the chamber 25 and to control the pressure of gas in the chamber 25. The exhaust system 75 typically comprises an exhaust conduit having a throttle valve 80, and a plurality of pumps 85 such as roughing pumps and turbomolecular pumps. The process gas is energized by coupling RF energy to the process gas in the chamber 25 (as shown) or the process gas can be energized by microwaves in a remote chamber adjacent to the chamber 25 (not shown). In the exemplary chamber 25, the process gas is energized to form a plasma by applying an RF current to an inductor coil 95 adjacent to the ceiling 35 to inductively couple RF energy to the gas in the chamber 25. The frequency of the RF energy applied to the inductor coil 95 is typically from about 50 KHz to about 60 MHz, and more typically about 13.56 MHz.

Figure 2:
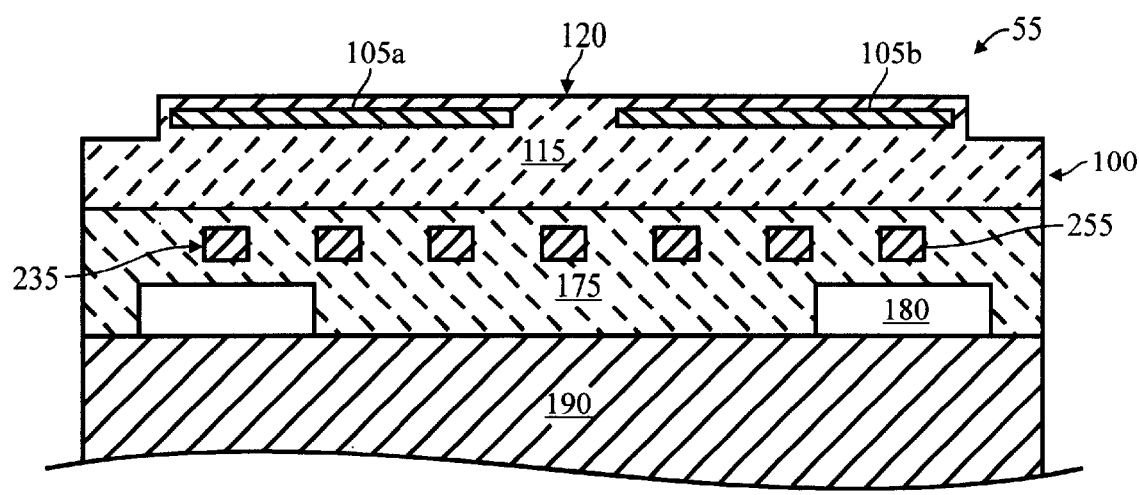
FIG. 2 is a schematic sectional side view of an electrostatic chuck having a base comprising channels for circulating heat transfer fluid.

The electrostatic chuck 55 includes an electrostatic member 100 comprising an electrode 105 covered by or embedded in a dielectric 115, and having a receiving surface 120 for receiving the substrate 30. A heat transfer gas, typically helium, is supplied from a heat transfer gas supply 125 and through a conduit 130 to grooves 135 in the receiving surface 120 to enhance heat transfer rates between the substrate 30 and the electrostatic chuck 55. The dielectric 115 comprises a material that allows RF energy to be coupled from the electrode 105 to the plasma, and that also serves as an insulator that allows a DC voltage applied to the electrode 105 to electrostatically hold the substrate 30. The electrode 105 of the electrostatic member 100 comprises a single electrical conductor for monopolar operation (as shown in FIG. 1) or two more electrically isolated conductors for bipolar operation (as shown in FIG. 2). In a monopolar chuck 55, a voltage applied to the electrode 105 causes electrostatic charges to accumulate in the electrode 105 or in the dielectric 115. Energized process gas above the substrate 30 provides electrically charged species having opposing polarity which accumulate in the substrate 30 resulting in an attractive electrostatic forces that holds the substrate 30 to the receiving surface 120 of the electrostatic chuck 55. In a bipolar chuck 55, at least two electrodes 105a,b are maintained at different electric potentials, thereby inducing electrostatic charges in the substrate 30 that hold it to the receiving surface 120. An electrical connector 140 electrically connects the electrode 105 to a voltage supply 145 to provide desired voltage to the electrode 105 to electrostatically hold the substrate 30. Optionally, the voltage supply 145 also provides an RF voltage to the electrode 105 to energize and accelerate the plasma species toward the substrate 30 by capacitively coupling of RF energy to the plasma.

To operate the electrostatic chuck 55, the chamber 25 is evacuated and maintained at a sub-atmospheric pressure. A lift pin assembly 155 comprises lift pins 160a,b that are elevated through holes 165a,b in the electrostatic chuck 55 by a pneumatic lift mechanism 170. A robot arm (not shown) places the substrate 30 on the lift pins 160a,b, and the pneumatic lift mechanism 170 lowers the substrate 30 onto the receiving surface 120. After the substrate 30 is placed on the electrostatic chuck 55, the electrode 105 of the electrostatic chuck is electrically biased with respect to the substrate 30 by the voltage supply 145 to electrostatically hold the substrate 30. The voltage supply 145 provides a DC voltage of about 1000 to 3000 volts to the electrode 105. Helium, is supplied through the conduits 130 to grooves 135 in the receiving surface 120 at the interface between the substrate 30 and the electrostatic chuck 55 to thermally couple the substrate 30 to the electrostatic chuck 55. Thereafter, an energized process gas is provided in the chamber 25 to process the substrate 30 held on the substrate. On completion of the process, the pneumatic lift mechanism 170 raises the lift pins 160 to raise the substrate 30 off the receiving surface 120, allowing the substrate 30 to be removed by the robotic arm (not shown). Before raising the lift pins 160, the substrate 30 is electrically decoupled or de-chucked by dissipating the residual electrical charges holding the substrate 30 to the electrostatic chuck 55. This is accomplished, after the voltage to the electrode 105 is turned off, by grounding the electrode 105 or maintaining a plasma at another power level to provide a path to electrical ground for the electrostatic charges accumulated in the substrate 30.

Particular aspects of the electrostatic chuck 55 and the system for supporting and holding the chuck 55 in the chamber 25 will now be described. As shown in FIG. 2, generally, the electrostatic member 100 of the electrostatic chuck 55 is supported by a base 175 that is shaped and sized to match the electrostatic member 100 to promote efficient heat transfer across the interfaces therebetween. The base 175 can comprise channels 180 through which heat transfer fluid is circulated to raise or lower the temperature of a substrate 30 held on the receiving surface 120 of the electrostatic member 100. This enables the temperature of the substrate to be precisely controlled to provide more uniform processing. A support 190 can also be provided to support the base 175, and the support 190 rests on the surface 50 of the chamber 25. The base 175 and the support 190 secure the electrostatic chuck 55 to the chamber 25, provide reduced levels of thermal expansion mismatch, and provide more uniform heat transfer rates across the interfaces therebetween.

Base

In one aspect of the present invention, the base 175 for supporting the electrostatic member 100 is fabricated to have a coefficient of thermal expansion that is sufficiently close to that of the electrostatic member 100 to reduce thermal expansion stresses that would otherwise cause the electrostatic member 100 to separate from the base 175. In this version, the base 175 comprises a composite material having a tailored coefficient of thermal expansion. The composite base 175 is composed of a plurality of materials, for example, a mixture of two or more materials, including a first material and a second material, the volume fraction of the two materials being selected so that the base 175 has a coefficient of thermal expansion that is within about ±30% of a coefficient of thermal expansion of the electrostatic member 100. Preferably, the first material is a ceramic and the second material is a metal to provide a composite material having some ductility and increased fracture toughness.

Figure 3:
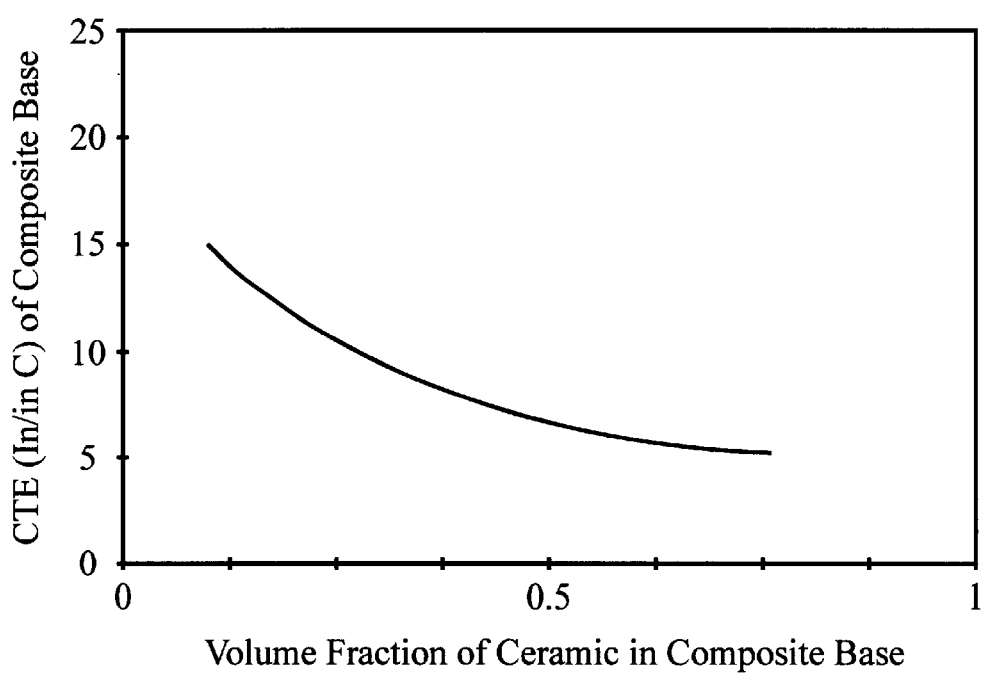
FIG. 3 is a graph showing the change in the coefficient of thermal expansion of a base for increasing volume fraction of ceramic in the base.

In one version, the base 175 comprises a porous ceramic infiltrated with molten metal. The metal fills all the pores in the ceramic when they are open and interconnected to one another, or only some of the pores at the surface of the porous ceramic, when the pores are not interconnected throughout the structure. The coefficient of thermal expansion of a base 175 comprising a porous ceramic infiltrated with a molten metal is tailored by varying the volume fraction of the ceramic to the metal. FIG. 3 shows the change in the coefficient of thermal expansion of the base 175 for increasing volume fraction of ceramic based on the formula $$\alpha_b = (\alpha_m V_m E_m + \alpha_c V_c E_c)/(V_m E_m + V_c E_c),$$

where $\alpha_b$ is the CTE for the base 175, $\alpha_m$, $V_m$, and $E_m$, respectively, are the CTE, volume fraction, and Young's modulus for the metal, and $\alpha_c$, $V_c$, and $E_c$, respectively, are the CTE, volume fraction, and Young's modulus for the ceramic material.

For example, when the electrostatic member 100 comprises dielectric 115 composed of aluminum nitride, preferably, the base 175 comprises a coefficient of thermal expansion of from about 3 to about 15 ppm/° C., and more preferably from about 4 to about 10 ppm/° C., to provide a suitable level of CTE matching between the base 175 and the electrostatic member 100.

The ceramic material is capable of withstanding temperatures of at least about 400° C. and more preferably at least about 600° C. Suitable ceramic materials include one or more of aluminum oxide, aluminum nitride, boron carbide, carbon, cordierite, mullite, silicon carbide, silicon nitride, silicon dioxide and zirconium oxide. Suitable metals for infiltrating the porous ceramic include aluminum, copper, iron, molybdenum, titanium, tungsten or alloys thereof. The porous ceramic preferably comprises a pore volume of from about 20 to about 80 volume % to provide a sufficiently large volume for metal infiltration. In a preferred embodiment, the base 175 comprises silicon carbide (SiC) infiltrated with aluminum (Al), the volume fraction of the ceramic to the metal being from about 20 to about 80 volume %. As the volume fraction of ceramic to metal changes, so does the thermal and mechanical properties of the base 175. For example, referring to Table I, it is seen that for a base 175 comprising a silicon carbide infiltrated by aluminum, the coefficient of thermal expansion and tensile strength of the base 175 decreases as the volume fraction of ceramic to metal increases, while the thermal conductivity remains constant.

TABLE I

| VOLUME FRACTION OF CERAMIC TO METAL (%) | 63% SiC | 65% SiC | 70% SiC |
|---|---|---|---|
| CTE (ppm/° C.) | 7.9–8.1 | 7.2–7.7 | 5.7–7.0 |
| TENSILE STRENGTH (GPa) | 249 | 205 | 192 |
| THERMAL CONDUCTIVITY (W/mk) | 175 | 175 | 175 |

Figure 4A:
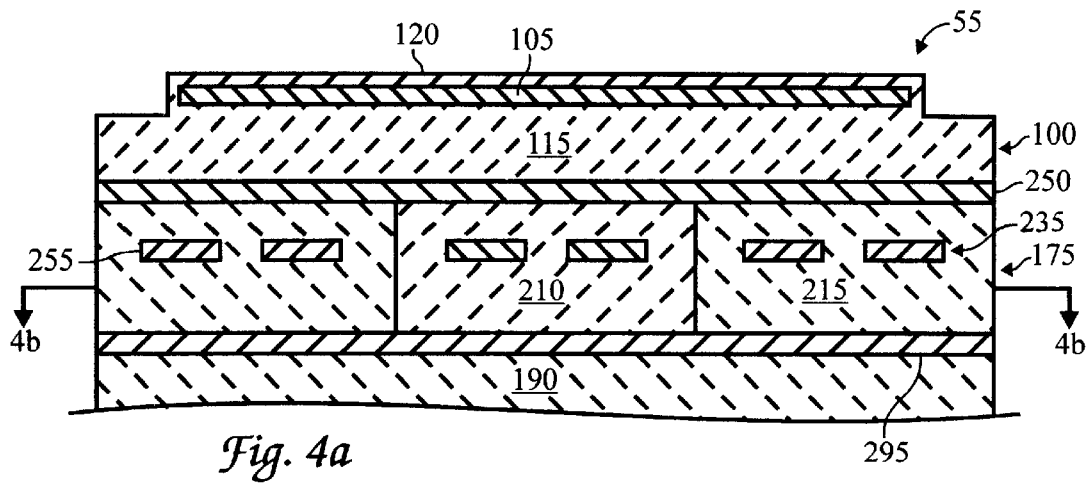
FIG. 4a is a schematic sectional side view of an electrostatic chuck comprising a base comprising two components, namely a central disk and an annular ring.
Figure 4B:
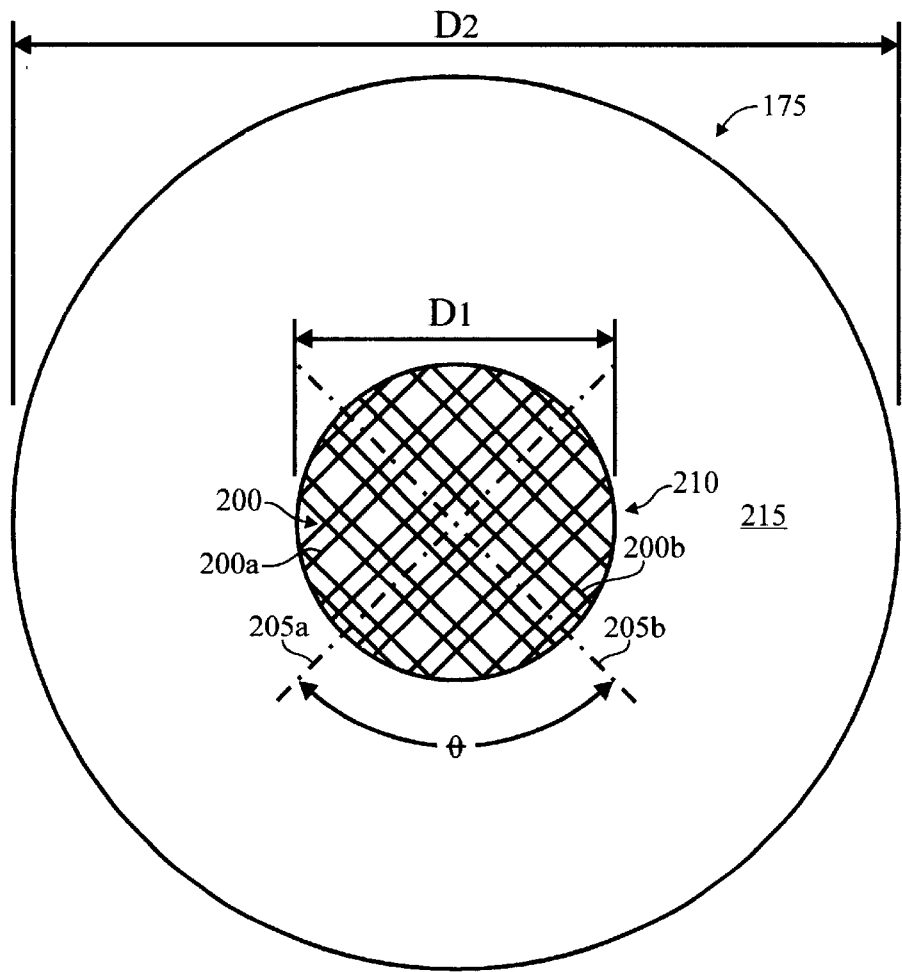
FIG. 4b is a schematic top plan view of the base of FIG. 4a showing the central disk having carbon fibers oriented in at least two orthogonal directions.

In another version, the base 175 further comprises carbon fibers 200 that are oriented to provide a coefficient of thermal expansion that matches that of the ceramic dielectric 115. For example, as shown in FIG. 4b, the base 175 can comprise a first set of carbon fibers 200a oriented parallel to a first axis of orientation 205a, and a second set of carbon fibers 200b oriented parallel to a second axis of orientation 205b that is at an angle φ with respect to the first axis of orientation 205a. Preferably, the orientation and volume fraction of carbon fibers 200 are selected so that the base 175 has a coefficient of thermal expansion that is substantially isotropic in the same plane as that of the processing surface of the substrate 30 to minimize thermal expansion stresses on the electrostatic member 100. More preferably, the base 175 comprises carbon fibers 200 that are oriented in a plurality of orthogonal directions. The carbon fibers 200 oriented in a particular direction expand in the direction parallel to their axis 205a or 205b. Thus, orienting the carbon fibers 200 in orthogonal directions within a single plane tends to substantially equalize their thermal expansion in two or more different axial directions within the same plane to provide a more uniform coefficient of thermal expansion within the plane. In addition, the base 175 can comprise carbon fibers 200 oriented in a plurality of directions within the single plane—for example, at 20, 45, or 60° intervals—to provide an even more anisotropic thermal expansion within the plane.

The coefficient of thermal expansion of the base 175 can be further tailored to match that of the electrostatic member 100 by forming a base 175 comprising a hybrid or plurality of component members that each have a different coefficient of thermal expansion. The overall coefficient of thermal expansion of the base 175 depends on the expansion coefficient of the individual component members and on their linear dimensions, $$\alpha_b = (\alpha_1 D_1 + \alpha_2 (D_2 - D_1))/D_2,$$

where $\alpha_b$ is the overall coefficient of thermal expansion of the hybrid composite base, $\alpha_1$ and $\alpha_2$ are CTEs of individual component members, and $D_1$ and $D_2$ are linear dimensions of individual component members.

Preferably, the ratio of the linear dimensions of the component members are selected so that the coefficient of thermal expansion of the base 175 is within about ±30% of the CTE of the electrostatic member 100. The components of the base 175 are shaped and sized to cooperate to achieve multifunctional properties. For example, as shown in FIGS. 4a and 4b, the base 175 can comprise two components 210, 215 having circular symmetry to one another to provide different coefficients of thermal expansion at the center 220 and peripheral edge 225 of the overlying electrostatic chuck 55. In this version, the base 175 comprises a disk 210 surrounded by an annular ring 215, each having a different average coefficient of thermal expansion. Both the disk 210 and the annular ring 215 are made up of a porous ceramic infiltrated with metal as described above. However, the volume fraction of the ceramic to metal is different in each, and one or more can comprise carbon fibers 200 in differing volume fractions. FIG. 4b shows a base 175 having a disk 210 comprising a composite material containing carbon fibers 200 that are oriented in at least two orthogonal directions to provide a more uniform expansion coefficient in a plane parallel to the plane of the substrate 30. The disk 210 is surrounded by an annular ring 215 made of porous silicon carbide infiltrated with metal.

Figure 5:
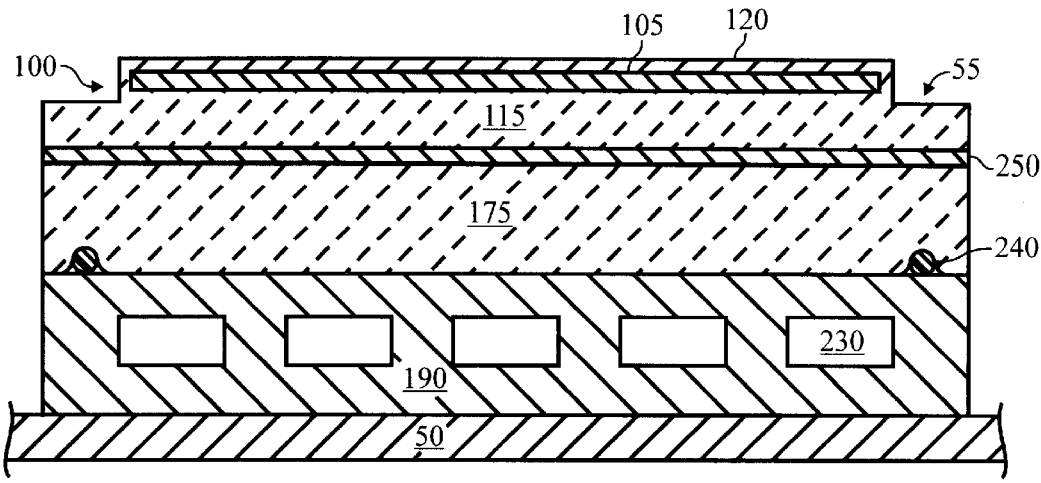
FIG. 5 is a schematic sectional side view of an electrostatic member, a base, and a support having channels for circulating heat transfer fluid.

In still another version, shown in FIG. 5, the base 175 comprises a thermally insulating material such as a ceramic member that thermally insulates the electrostatic chuck 55 from the surface 50 of the chamber 25 (not shown) or the support 190. In this embodiment, the support 190 further comprises channels 230 for circulating heat transfer fluid therethrough. The base 175 serves as an interposer member lying between the electrostatic chuck 55 and the surface 50 of the chamber 25 or between the electrostatic chuck 55 and the support 190. This reduces the heat escaping from the electrostatic chuck 55 via heat conduction through the surface 50 of the chamber 25 to maintain the substrate 30 at higher temperatures. In addition, the base 175 enables the electrostatic chuck 55 to form a gas tight seal with an underlying support 190 or surface 50 of the chamber 25 by use of a conventional polymer O-ring 240. The O-ring 240 is typically made from a polymer, such as polyethylene, polyurethane, polycarbonate, polystyrene, nylon, polypropylene, polyvinylchloride, fluoroethylene polymers, or silicone, all of which are susceptible to damage by high temperatures. For example, temperatures of over 200° C. can cause a polyimide O-ring to lose its resilience and its ability to form a seal. Because of its low thermal conductivity, the base 175 provides a temperature differential sufficient high to enable the electrostatic chuck 55 to be vacuum sealed to the support 190 by an O-ring 240 without degradation of the O-ring. Preferably, the base 175 comprises a thermal conductivity sufficiently low to provide a temperature differential of at least about 100° C. between the receiving surface 120 of the electrostatic chuck 55 and the bottom surface 50 of the chamber 25 or the support 190. More preferably, the base 175 comprises a thermal conductivity of less than about 6 W/mK.

In the embodiment shown in FIG. 5, the base 175 is made from a ceramic material, such as for example, aluminum oxide, aluminum nitride, boron carbide, carbon, cordierite, mullite, silicon carbide, silicon nitride, silicon dioxide and zirconium oxide. Of these mullite and cordierite are preferred, because they have thermal conductivities of less than about 6 W/mK and coefficients of thermal expansion of about 5 ppm/° C. which is very close to that of the dielectric 115 of the electrostatic chuck 55. Both mullite and cordierite also have a high resistance to thermal shock. Thermal shock results from the thermal stress caused by rapid heating and cooling and it can cause microcracks to occur in a material which lead to structural failure. Thus, a high resistance to failure from thermal shock is desirable for a base 175 that is alternately heated and cooled by the support 190. In addition to having a high resistance to thermal shock, both mullite and cordierite have a high resistance to erosion by energized process gases making them useful in processes using reactive process gases, such as fluorine.

Bond Layer

Figure 6:
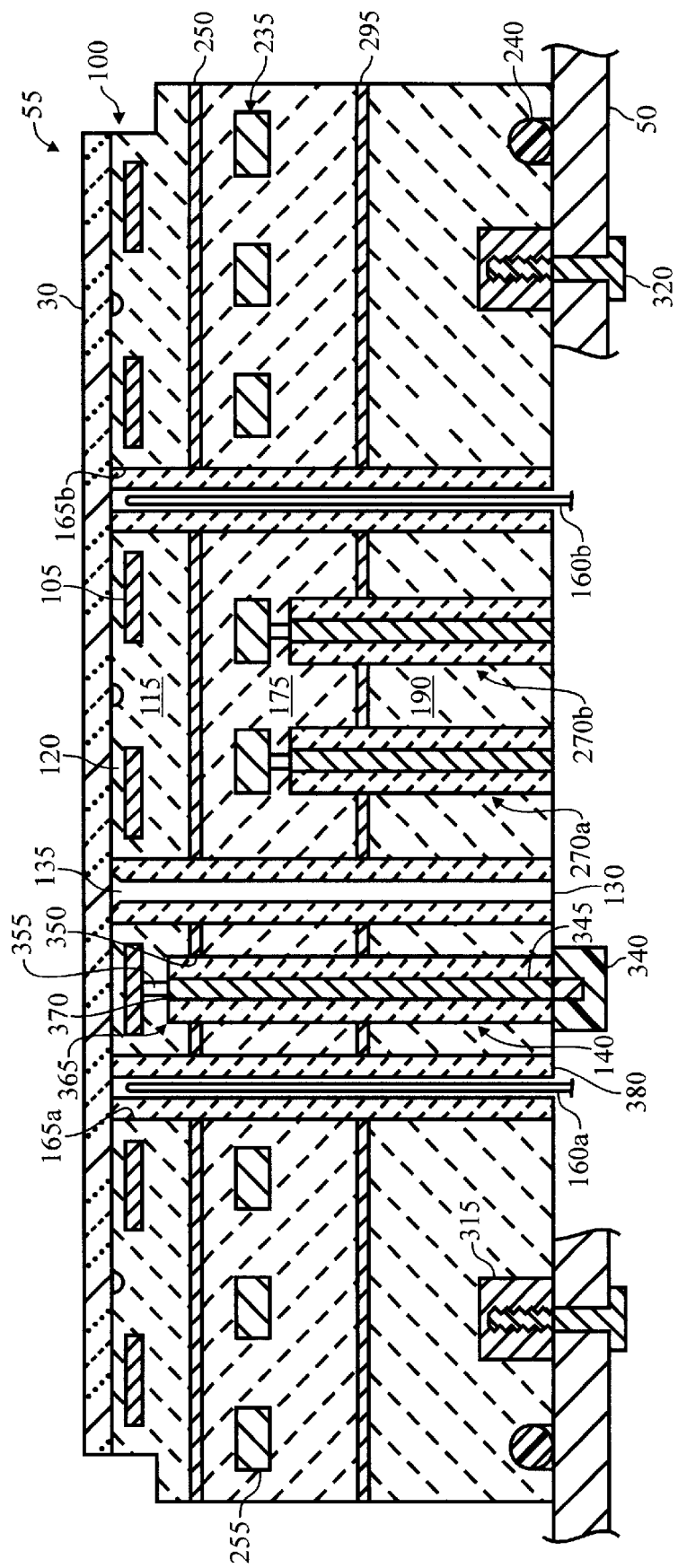
FIG. 6 is a schematic sectional side view of another version of an electrostatic chuck.

In another aspect of the present invention, the base 175 is bonded or joined to the electrostatic member 100 by a bond layer 250 made from a material having high thermal conductivity, as illustrated in FIG. 6. The bond layer 250 can comprise, for example a metal, such as aluminum, copper, iron, molybdenum, titanium, tungsten or alloys thereof, to provide more uniform heat transfer rates across the bond layer 250 which is desirable to provide more uniform processing. The bond layer 250 eliminates use of bolts for securing the electrostatic member 100 to the base 175 and consequently reduces mechanical stresses on the electrostatic chuck 55. Also, the bond layer 250 has a homogeneous composition that provides more uniform heat transfer rates across the substrate 30, and reduces the differences in thermal impedances that occur at the interface between the base 175 and the electrostatic member 100. Differences in thermal impedances can occur, for example, at the interface between the base 175 and the electrostatic member 100 that has a rough surface with gaps and non-contact areas that have a high thermal impedance relative to regions having smooth surfaces. The bond layer 250 is especially desirable for an electrostatic chuck 55 comprising a ceramic dielectric 115 which has a lower surface 252 that forms the interface between the electrostatic member 100 and the base 175 that often contains microscopic gaps and fissures (not shown). In conventional electrostatic chucks, these gaps and fissures can create a thermal barrier between the electrostatic member 100 and the base 175. In contrast, in an electrostatic chuck 55 according to the present invention, the bond layer 250 fills the gaps and fissures to provide a smooth surface to provide more controllable and uniform heat transfer rates.

Preferably, the bond layer 250 is ductile and compliant to provide an interface that absorbs the thermal stresses arising from the thermal expansion mismatch between the dielectric 115 of the electrostatic member 100 and the base 175 without damaging the electrostatic chuck. While a bonded joint provides uniform heat transfer rates, it is often difficult for a bonded joint to withstand the thermal stresses arising from differences in thermal expansion coefficients of dissimilar materials, such as the electrostatic member 100 and the base 175. A bond layer 250 according to the present invention, made from a ductile and compliant material can flex and absorb thermal stresses that arise from the difference in thermal expansion coefficients of the electrostatic member 100 and the base 175. The bond layer 250 could also be made from a polymer which is compliant and able to absorb thermal stresses. However, conventional polymer materials are often eroded by erosive plasma and process gases, and thus it is preferred to use a compliant metal to form the bond layer 250. Also, the bond layer made of metal generally has a higher thermal conductivity than a bond layer made of polymer.

Preferably, the bond layer 250 is made by infiltrating molten metal into the interface between the dielectric 115 and the base 175. For example, a base 175 comprising a composite of porous ceramic and metal can be bonded to the dielectric 115 of the electrostatic member 100 by a bond layer 250 which is formed by infiltrating molten metal into the porous ceramic of the dielectric 115 and base 175. During the infiltration process, the molten metal reacts with the ceramic material to form an interfacial reaction layer that forms the bond layer 250. It is believed that the reaction layer is confined to a zone near their contact surfaces and penetrates less than about 250 µm into each porous ceramic surface to provide a bond layer 250 having a thickness of from about 50 to about 500 µm. This method of joining the electrostatic member 100 to the base 175 provides a strong, vacuum tight, bond layer 250 that is also substantially free of voids and provides uniform thermal transfer rates across the interface between the base 175 and the electrostatic member 100. Furthermore, infiltration of molten metal into the porous ceramic provides a relatively thin bond layer 250 that minimizes bowing of the electrostatic member 100 which would otherwise warp the receiving surface 120 and render the electrostatic chuck 55 unusable.

In another version, the base 175 and the electrostatic member 100 are joined together by brazing. By brazing it is meant bonding of a ceramic member to another ceramic or metal member, using an alloy having a melting point lower than either of the members being joined. In one method, a thin sheet of brazing metal (not shown) is placed between the electrostatic member 100 and the base 175. The assembled electrostatic member 100 and base 175 is heated to allow the metal to react with surfaces of the electrostatic member 100 and the base 175 to form the strong ductile bond layer 250. Alternatively, the brazing metal can be deposited directly on the surfaces to be joined and the assembled electrostatic member 100 and base 175 heated to form the bond layer 250. The brazing metal can comprise aluminum, zinc, copper, silicon, or alloys thereof. The assembled electrostatic member 100 and base 175 are heated to a temperature sufficiently high to melt the brazing metal, but less than the temperatures that would cause softening of the electrostatic member 100 and base 175. Generally, the electrostatic member 100 and base 175 are heated to a temperature of up to about 600° C. for about 180 seconds to form the brazed bond layer 250.

Heater

In another aspect of the present invention, the electrostatic chuck 55 comprises a heater 235 positioned below and abutting the dielectric 115 of the electrostatic member 100 to heat the substrate 30. The dielectric 115 diffuses the heat from the heater 235 and thereby provides more uniform temperatures across the substrate 30. Also, the ability of the ceramic material of the dielectric 115 to withstand high temperatures allows the heater 235 to be operated at more elevated temperatures than that obtainable with an electrostatic chuck 55 having a polymer dielectric. A preferred heater 235 comprises a resistive heating element 255 that has a resistance sufficiently high to raise the temperature of the substrate 30 by at least about 100° C. The resistive heating element 255 can be made from tungsten, molybdenum, iron, nickel, copper, Inconel or alloys thereof. Preferably, the resistive heating element 255 comprises a planar shape that is sized to match the size of the substrate 30 to provide a heat flux that is relatively uniform across the entire backside of the substrate 30. The resistive heating element 255 can be shaped as a flat coil wound in a spiral or whirl, a wire mesh, or a zig-zag shaped element. A heater power supply 260 is electrically connected to the resistive heating element 255 to power the heater 235. The resistive heating element 255 is electrically connected to the heater power supply 260 by heater connectors 270a,b that comprise a refractory metal and are bonded to the resistive heating element 255 by infiltration of a metal having a relatively low melting temperature. The heater power supply 260 comprises a source which has a power output of from about 500 to about 3500 watts, and which can be adjusted to provide a current level that achieves a desired substrate temperature. Preferably, a temperature controller 275 is provided to monitor the substrate temperature and adjust the output of the heater 235 to maintain the substrate 30 at temperatures from about 25 to about 500° C.

Preferably, the heater 235 is embedded in the base 175 rather than in the dielectric 115 of the electrostatic member 100. Prior art chucks that have a heater embedded in a ceramic dielectric often crack from the high thermal stresses generated by localized expansion of the ceramic material surrounding the heater 235. In contrast, placing the heater 235 below the ceramic dielectric 115 or inside the base 175 heats the base 175 which uniformly heats the dielectric 115 by conduction without causing excessive thermal stresses in the dielectric 115. Also, the embedded heater 235 can maintain the substrate 30 in a small range of temperatures with more accuracy and stability than that obtained by radiative heating, because the thermal mass of the base 175 and the dielectric 115 serve as heat sinks that prevent localized temperature fluctuations from excessively changing the temperature of the substrate 30.

The substrate 30 is heated by powering the resistive heating element 255 of the heater 235 by the heater power supply 260. A power level of the current provided by the heater power supply 260 is adjusted by the temperature controller 275 in relation to a measured temperature of the substrate 30 to raise the substrate 30 to a temperature suitable for processing the substrate 30. The base 175 can reduce the flow of heat from the electrostatic chuck 55 to the support 190 or the surface 50 of the chamber 25. Optionally, heat is removed from a support 190 below the base 175 by circulating a heat transfer fluid through the channels 230 in the support 190. During processing, the temperature of the substrate 30 is monitored using a temperature sensor 285, such as a thermocouple embedded in the receiving surface 120 that provides a signal to the temperature controller 275 that controls the heater 235 to maintain the substrate 30 within the desired narrow temperature range. Preferably, the electrostatic chuck 55 of the present invention is able to maintain the substrate 30 at a temperature of from about 25 to about 500° C. within a range of about ±10° C., and more preferably, within a range of about ±5° C.

Support

The support 190 serves to secure the electrostatic chuck 55 to the chamber 25, and also perform one or more of other functions, such as reduce thermal expansion stresses between the chuck 55, base 175, and chamber 25; serve as a thermal insulator or thermal conductor depending upon the desired temperature of the substrate 30; and also control heat transfer rates between the substrate 30 and the chamber 25.

One version of the support 190 is adapted to reduce thermal expansion stresses between the chuck 55, base 175, and the surface 50 of the chamber 25. In this version, the support 190 is fabricated from a material having a coefficient of thermal expansion that is within about ±30% of a coefficient of thermal expansion of the base 175. More preferably, the support 190 comprises a coefficient of thermal expansion of from about 2 to about 27 ppm/° C. and most preferably of from about 3 to about 12 ppm/° C. The support 190 comprises a ceramic, metal, or composite or mixture of ceramic and metal, including by way of example, one or more of aluminum oxide, aluminum nitride, boron carbide, carbon, cordierite, mullite, silicon carbide, silicon nitride, silicon dioxide, zirconium oxide, aluminum, copper, molybdenum, titanium, tungsten, zirconium and mixtures thereof. For example, a suitable support 190 for matching the thermal expansion coefficient of a base 175 comprising a composite of aluminum and silicon carbide (AlSiC) (which has a CTE of from about 4 to about 10 ppm/° C.) comprises zirconium (which has a CTE of about 6 ppm/° C.).

In another version, the support 190 is bonded to the base 175 of the electrostatic chuck 55 by a second bond layer 295 of compliant and ductile material that is provided to further absorb the thermal stresses that occur from differences in thermal expansion of the support 190 and the base 175. The bond layer 295 also generally has a thickness of from about 50 to about 500 µm. The bond layer 295 is made from a metal such as aluminum, copper, iron, molybdenum, titanium, tungsten or alloys thereof. In addition, the bond layer 295 provides an interface with a more homogeneous composition and more uniform heat transfer rates to and from the substrate 30. The bond layer 295 also reduces the differences in thermal impedances that occur at the interface between the base 175 and the electrostatic member 100.

Figure 7A:
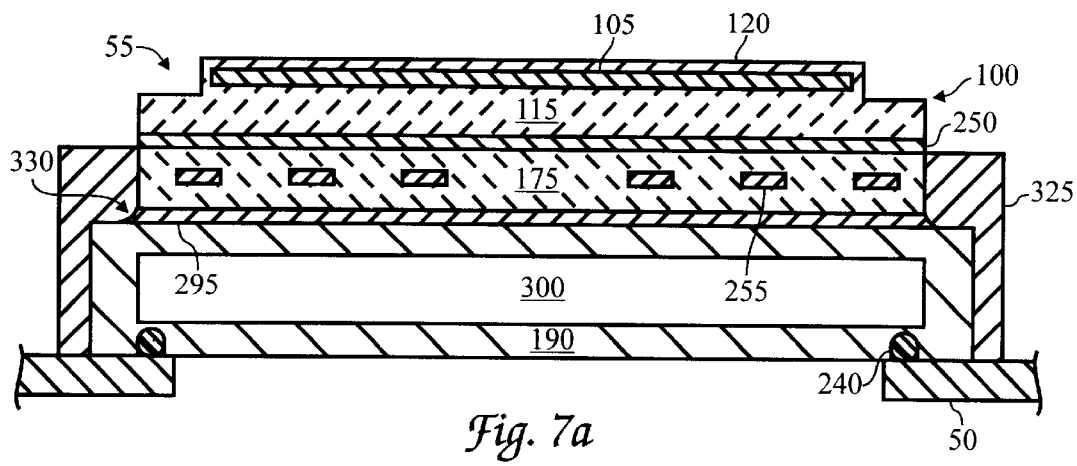
FIG. 7a is a schematic sectional side view of an electrostatic member, a base, and a support comprising a cavity that thermally isolates the base from a surface of a chamber.
Figure 7B:
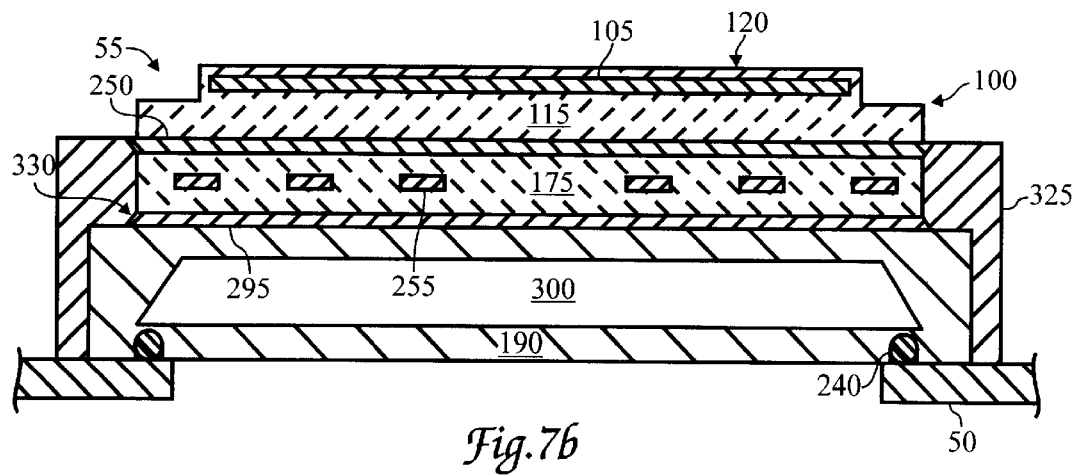
FIG. 7b is a schematic sectional side view of another embodiment of the support comprising a cavity having a trapezoidal cross-section.
Figure 7C:
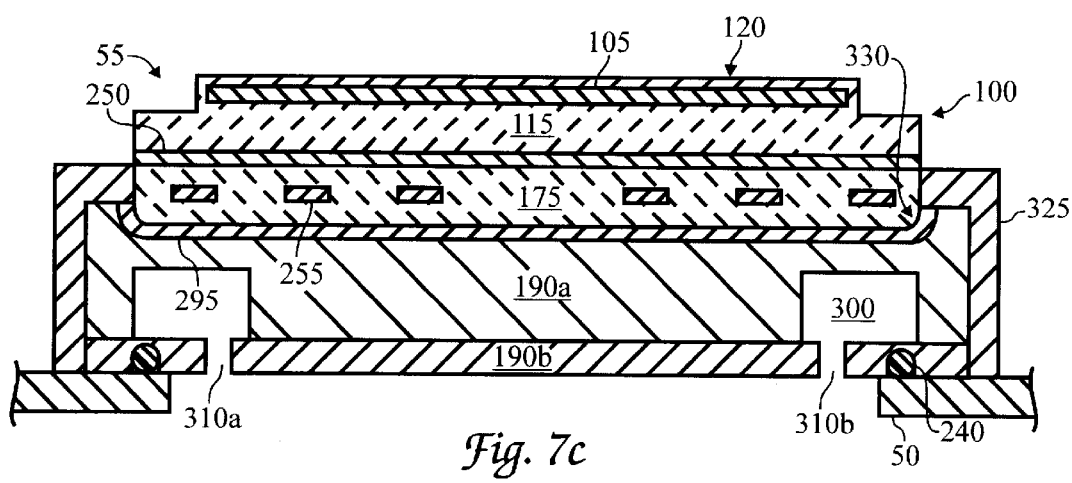
FIG. 7c is a schematic sectional side view of yet another embodiment of the support comprising a channel having a rectangular cross-section, a gas inlet for supplying gas to the channel, and a gas outlet for removing gas from the channel.

Referring to FIGS. 7a to 7c, in another version, the support 190 is adapted to thermally insulate the base 175 of the electrostatic chuck 55 from the surface 50 of the chamber 25. In this version, the support 190 comprises a cavity 300 that is shaped and sized to serve as a thermal barrier that insulates the electrostatic chuck 55 from the surface 50 of the chamber 25. The cavity 300 is shaped and sized to provide a temperature differential that is sufficient to enable the electrostatic chuck 55 to be sealed to the surface 50 by a conventional low temperature vacuum seal, such as an O-ring 240. As explained above, high temperatures can cause the polymer O-ring 240 to lose its resilience and therefore its ability to form a seal. Preferably, the support 190 with the cavity 300 comprises a thermal conductivity of less than about 6 W/mK to control heat transfer rates from the electrostatic chuck 55. More preferably, the support 190 comprises a cavity 300 having a cross-sectional area that is shaped and sized to provide a temperature differential of at least about 100° C. between the chuck 55 and the surface 50 of the chamber 25 when the substrate 30 is held at a temperature of about 500° C.

Referring to FIG. 7a, the cavity 300 comprises a cross-section having dimensions only slightly smaller than and corresponding to those of the support 190. Alternatively, the cavity 300 can comprise a more complex shape tailored to control the rate at which heat is removed from different portions of the base 175 to provide more uniform temperatures across the receiving surface 120 of the electrostatic chuck 55. For example, as shown in FIG. 7b, the cavity 300 can also comprise a trapezoidal cross-section to increase heat removal from the peripheral edge of the electrostatic chuck 55, when the peripheral edge is subjected to a higher heat load from the energized process gas. In another alternative, shown in FIG. 7c, the cavity 300 comprise an annular channel having a rectangular cross-section which allows more heat to be removed from the center of the base 175 thereby compensating for a greater heat flux at the center of the electrostatic chuck 55.

Referring to FIG. 7c, the cavity 300 can further comprise a gas inlet 310a and a gas outlet 310b for supplying and removing a gas, such as helium, argon, nitrogen, or air to the cavity 300. By varying the pressure of the gas in the cavity 300, the amount of heat conducted from the substrate 30 through the support 190 can also be varied. The pressure of the gas in the cavity 300 is regulated to maintain substantially uniform temperatures across the receiving surface 120 of the chuck 55. Typically, the pressure of the gas is less than about 50 mTorr, and more preferably, the pressure of the gas is from about 2 to about 50 mTorr.

Optionally, as illustrated in FIG. 6, the support 190 can comprise threaded inserts 315 of a low thermal expansion alloy, such as Kovar™ or Invar™, into which bolts 320 are threaded to secure the support 190 (with the electrostatic chuck 55 bonded thereto) to the chamber 15. The threaded inserts 315 provide greater resilience and compliance than the brittle material of a ceramic support 190 and are more easily machined to provide threads for receiving the bolts 320. Alternatively, the support 190 is secured in the chamber 25 by a clamping ring 325, as shown in FIG. 1. The clamping ring 325 allows movement due to differences in thermal expansion of the support 190 and the surface 50 of the chamber 25, thereby preventing warping or cracking of the support 190 and improving the reliability of the vacuum seal between the support 190 and the surface 50. Also, any mechanical stresses induced by conventional mounting bolts made of metal are reduced, thereby extending the operating life of the electrostatic chuck 55 and support 190. In yet another embodiment, shown in FIGS. 7a to 7c, one or more of the clamping ring 325, the base 175, or the support 190 comprise a curved surface 330 which further reduces the mechanical stresses on the electrostatic chuck 55 and the support 190 by distributing a clamping force over a larger area.

Method of Fabrication

In another aspect, the present invention is directed to a method of fabricating an electrostatic chuck 55 comprising an electrostatic member 100 having an electrode 105 covered by a dielectric 115, a base 175 joined to the electrostatic member 100, and, optionally, a heater 235. A preferred method of fabricating the electrostatic chuck 55 will now be described; however, other methods of fabrication can be used to form the electrostatic chuck 55 and the present invention should not be limited to the illustrative methods described herein.

Forming the Electrostatic Member

The dielectric 115 of the electrostatic member 100 comprises a ceramic or polymer material. Suitable high temperature materials include ceramics such as for example, one or more of aluminum oxide, aluminum nitride, silicon nitride, silicon dioxide, titanium dioxide, zirconium oxide, or mixtures thereof. Generally, aluminum nitride is preferred for its high thermal conductivity which provides high heat transfer rates from the substrate 30 to the electrostatic chuck 55. Also, aluminum nitride has a low CTE of about 5.5 ppm/° C. which closely matches a CTE of an electrode 105 made of molybdenum which has a CTE of about 5.1 ppm/° C. Also, aluminum nitride exhibits good chemical resistance in erosive environments, especially halogen containing plasma environments. The dielectric 115 is formed by freeze casting, injection molding, pressure-forming, thermal spraying, or sintering a ceramic block with the electrode 105 embedded therein. Preferably, a ceramic powder is formed into a coherent mass in a pressure forming process by application of a high pressure and a temperature. Suitable pressure forming apparatuses include an autoclave, a platen press, or an isostatic press, as for example, described in U.S. patent application Ser. No. 08/965,690 filed Nov. 6, 1997; which is incorporated herein by reference.

The electrode 105 of the electrostatic member 100 comprises a refractory metal capable of withstanding high temperatures, such as temperatures of at least about 1500° C. Suitable metals include, for example, tungsten, molybdenum, titanium, nickel, tantalum, molybdenum or alloys thereof. Preferably, the electrode 105 is made of molybdenum, which has a thermal conductivity of about 138 W/mK, which is substantially higher than that of most metals and alloys commonly used for electrodes 105 and enhances heat transfer rates through the electrostatic member 100. In the embodiment shown in FIG. 6, the electrode 105 comprises a thin mesh which is embedded in the dielectric 115 and is shaped and sized depending upon the shape and size of the substrate 30.

In a preferred method of forming an electrostatic member 100 with an embedded electrode 105, an isostatic press is used to apply a uniform pressure over the entire surface of the electrostatic member (not shown). A typical isostatic press comprises a pressure resistant steel chamber having a pressurized fluid for applying a pressure on an isostatic molding bag. A powdered precursor comprising a suitable ceramic compound mixed with an organic binder, such as polyvinyl alcohol, is packed around the electrode 105 in the isostatic molding bag and the bag is inserted in the isostatic press. The fluid in the pressure chamber is pressurized to apply a pressure on the ceramic material. It is desirable to simultaneously remove air trapped in the isostatic molding bag using a vacuum pump to increase the cohesion of the powdered precursor. The unitary ceramic preform comprising a dielectric 115 having an electrode 105 therein is removed from the molding bag and sintered to form an electrostatic member 100 with an embedded electrode 105. The gas flow conduits 130 are subsequently formed in the electrostatic member 100 by drilling, boring, or milling; or they can be formed by placing suitable inserts in the ceramic preform during the molding process. After the electrostatic member 100 is formed, the receiving surface 120 is ground to obtain a flat surface to efficiently thermally couple the substrate 30 to the electrostatic chuck.

The electrical connector 140 is electrically connected to the electrode 105 of the electrostatic chuck 55 to conduct an electrical charge to the electrode 105 from a voltage supply terminal 340 in the chamber 25. The electrical connector 140 is also made of a refractory metal having a melting temperature of at least about 1500° C. Suitable metals include, for example, tungsten, titanium, nickel, tantalum, molybdenum or alloys thereof. The electrical connector 140 comprises a rod or plug 345 having a length sufficiently long to extend from the voltage supply terminal 340, through a hole 350 in the dielectric 115 and the support 190, to electrically engage the electrode 105. Other equivalent structures for the electrical connector 140 include rectangular leads, contact posts, and laminated conducting structures.

In a preferred structure, shown in FIG. 6, the plug 345 of the electrical connector 140 is bonded to the electrode 105 by a conducting material in a liquid phase. Preferably, the conducting liquid phase comprises a metal having a softening temperature of less than about 1500° C., and more preferably, less than about 600° C. Suitable materials include aluminum, copper, iron, molybdenum, titanium, tungsten or alloys thereof. The electrical connector 140 is aligned in the hole 350 to provide a gap 355 sufficiently large to allow the conducting liquid phase to infiltrate between and electrically connect the plug 345 to the electrode 105. The more ductile conducting material that fills the gap 355 also absorbs thermal stresses arising from the vertical expansion of the electrical connector 140 relative to other surrounding structures, such as the electrostatic member 100. The volume of gap 355 in which the metal is infiltrated is sufficiently large to enable the metal to substantially fill the space between the electrical connector 140 and the electrode 105 to provide a good electrical connection. However, it has been discovered that reducing the volume of gap 355 into which the metal is infiltrated serves to significantly reduce cracking of the ceramic material surrounding the electrical connector 140 and can also reduce bowing of the electrostatic member 100. In the embodiment shown in FIG. 6, the gap 355 is defined by a bore 365 in the dielectric 115, the bore 365 having a first diameter that is smaller than the outer diameter of the plug 345 of the electrical connector 140, and a second diameter larger than the diameter of the plug 345 to allow it to pass through. A shoulder 370 defined by the first and second diameters of the bore 365 serves as a stop that prevents the electrical connector 140 from contacting the electrode 105, thereby forming a gap 355 therebetween that can be infiltrated by molten or softened metal (which is later solidified) to electrically connect the plug 345 to the electrode 105. Thus, the electrical connector 140 is not joined directly to the electrode 105 but instead is electrically coupled via the gap 355 filled with a metal which can readily deform and absorb thermal expansion and other mechanical stresses. This joint provides a more reliable electrical connection between the electrical connector 140 and the electrode 105.

Figure 8A:
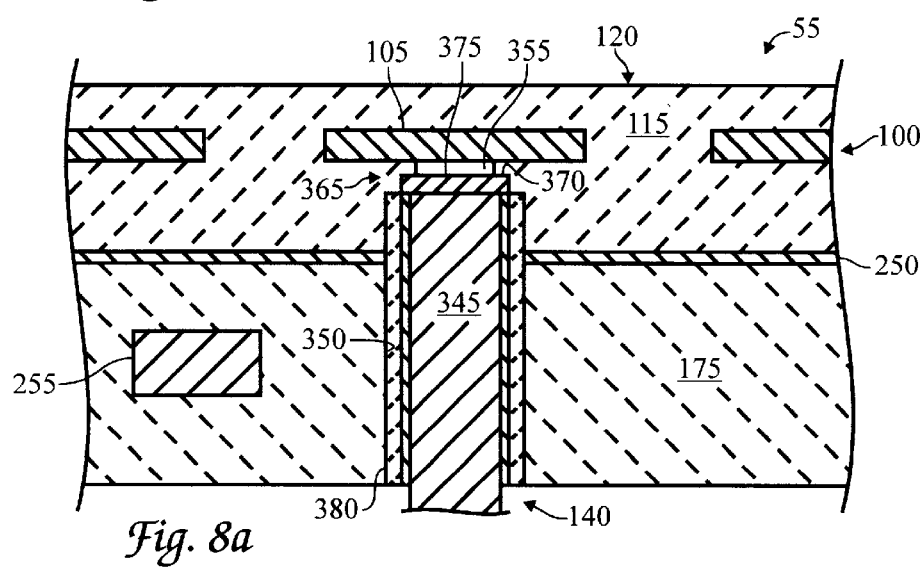
FIG. 8a is a schematic sectional side view of a portion of an electrostatic chuck showing an electrode, electrical connector, and a disc of conducting material therebetween.
Figure 8B:
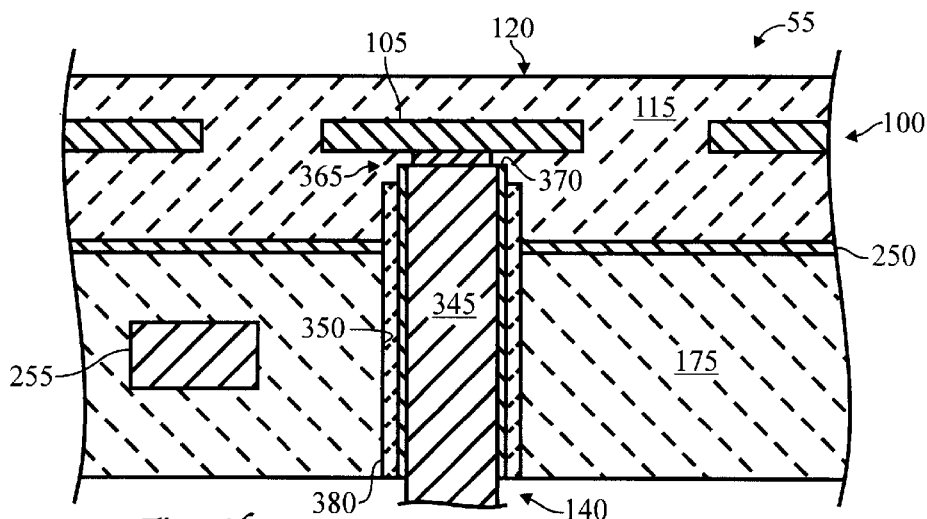
FIG. 8b shows the electrostatic chuck of FIG. 8a after the disc of conducting material being melted and cooled to electrically connect the electrode to the electrical connector.

Alternatively, the electrical connector 140 can be electrically connected to the electrode 105 by a brazed connection. Referring to FIGS. 8a and 8b, a metal insert 375 is placed between the plug 345 and the shoulder 370 of the bore 365. The electrostatic chuck 55 and the plug 345 are then heated causing the metal insert 375 to soften and fill the gap 355. Typically, the electrostatic chuck 55 and the plug 345 are maintained at a temperature of about 600° C. for at least about 180 seconds. Thereafter, they are cooled to solidify the metal in the gap 355 to form a brazed connection between the electrical connectors 140 and the electrode 105 as shown in FIG. 8b. Optionally, a pressure can be applied to the plug 345 of the electrical connector 140 while heating the electrostatic chuck 55 to cause the softened metal from the metal insert 375 to infiltrated and fill the gap 355.

Optionally, as shown in FIG. 6, tubes 380 of a ceramic material, such as aluminum oxide, extend through one or more of the dielectric 115, the support 190 and the base 175. These tubes 380 serve to electrically isolate electrical connector 140 and the heater connectors 270a,b from the bond layers 250, 295, the base 175, and the support 190. They also align the conduit 130 and holes 165a,b through which the lift pins 160 pass to prevent the formation of a plasma glow discharge therein during operation of the electrostatic chuck 55. The tubes 380 comprise an outer diameter that allows them to be held in place substantially without the use of an adhesive. Preferably, the tubes 380 surrounding the electrical connector 140 and the heater connector 270a,b comprise an inner dimension and a shape that conforms to the connectors 140, 270a,b. More preferably, the tubes 380 surrounding the conduits comprise an inner diameter sufficiently small to prevent plasma formation in the conduit 130 and in the lift pin holes 165a,b.

Forming the Base

The version of the base 175 supporting the electrostatic member 100 which comprises porous ceramic infiltrated with metal is fabricated by forming a ceramic preform (not shown) and infiltrating a liquid or molten metal into the ceramic. The ceramic preform is made from a ceramic powder having an average particle size that provides the desired volume of porosity in the ceramic preform. The average particle size of the ceramic powder can be obtained by milling processes, such as ball milling or attrition milling. The total porosity can be further increased or decreased using agglomerated powder comprising particles of various sizes. Although the desired pore size varies depending on the ceramic being infiltrated, it is generally desirable that the ceramic powder have an average particle size of from about 0.1 to about 50 μm, to yield a volume porosity of from about 20 to about 80 volume %.

The version of the base 175 supporting the electrostatic member 100 comprising an embedded heater 235 is formed by placing the resistive heating element 255 in a mold (not shown), packing the mold with ceramic powder, and applying a pressure of from about 48 MPa to about 69 MPa to the mold to form the preform. The pressure applied to the ceramic powder can be applied using an autoclave, a platen press, or an isostatic press. Preferably, an isostatic press is used to apply a uniform pressure over the entire surface of the mold to form a ceramic preform having high strength. In isostatic pressing, additives such as polyvinyl alcohol, plasticizers such as polyethylene glycol, and lubricants such as aluminum stearate are mixed with the ceramic powder to improve the mechanical strength of the preform. Because the preform has sufficient strength, voids for connectors 140, 270*a,b* to the electrode 105 and the resistive heating element 255, the conduit 130 for the heat transfer gas, and the holes 165*a,b* for the lift pins 160 can be formed using conventional machining techniques such as drilling, boring, or milling while the ceramic preform is in the green state.

The green preform is sintered to obtain a ceramic preform with the optional resistive heating element 255 embedded therein. In the sintering process, the green preform is heated in the presence of a gas at a high partial pressure in order to control the total porosity and average pore size of the sintered body. Preferably, the partial pressure of the gas is from about 1 to about 10 atmospheres. If binders or other organic materials are used in the preform forming process, these additives are burned out in the sintering step. In the sintering process, the green preform is placed in a furnace and slowly heated to a temperature of from about 300 to about 1200° C. in a flowing gas such as nitrogen to volatilize the organic materials to form a dense ceramic.

The second step of forming the base 175 involves an infiltration process. After a ceramic having the desired total porosity and pore size is obtained, a liquid phase of metal or molten metal is infiltrated into the voids or pores of the ceramic. The infiltration can be accomplished by any suitable process including, for example, a method in which molten metal is brought into contact with a ceramic and infiltrates into the interconnecting pores of the ceramic by capillary action. In a preferred method, infiltration is accomplished in a pressure vessel using a pressure infiltration process. In this method, the ceramic is placed in the pressure vessel with metal around it, and the vessel evacuated and heated to remove air from the pores of the ceramic. Once the pressure vessel is evacuated, the ceramic and surrounding metal are heated to a temperature corresponding to the softening temperature of the metal to be infiltrated. The molten metal is introduced into the pressure vessel under pressure to fill substantially all voids, cavities and pores in the ceramic. For example, in the embodiment wherein the ceramic comprises silicon carbide having a porosity of about 30%, the infiltration of molten aluminum is accomplished by maintaining the pressure vessel at a pressure of about 1030 kPa (150 psi), and a temperature of at least 600° C. for about 180 seconds.

Forming the Bond Layers

The base 175 is then bonded to the ceramic dielectric 115 of the electrostatic member 100 by the infiltration process described above. In a preferred embodiment, the electrostatic member 100 is placed on top of the base 175 in a pressure vessel and molten metal or alloy is brought into contact with the assembly. Typically, the process vessel is maintained at a pressure of from about 690 kPa (100 psi) to about 1380 kPa (200 psi), and the molten metal is maintained at temperature of from about 600 to about 700° C. for at least about 180 seconds. During the infiltration process, molten metal reacts with the ceramic dielectric 115, forming an intermetallic bond layer 250 between the electrostatic member 100 and the base 175. After infiltration, the assembled electrostatic chuck 55 is cooled to solidify the metal to form the bond layer 250. It has been found that a substantially void-free and crack-free bond between the electrostatic member 100 and the base 175 can be achieved by controlling the rate at which the electrostatic chuck assembly is cooled. Preferably, the electrostatic chuck assembly is cooled at a rate of from about 10 to about 100° C./hr.

In an alternative method, the base 175 is formed and bonded to the electrostatic member 100 in a single step. In this method, the electrostatic member 100 with the electrode 105 is placed on the sintered preform of the base 175 in a pressure vessel. Once the pressure vessel has been completely evacuated, a molten metal is introduced into the vessel under pressure to substantially fill surface voids, cavities and pores in the preform to form a base 175 and to also infiltrate into the interface and bond the base 175 to the electrostatic member 100.

In another embodiment, the support 190 is also bonded to the lower surface of the base 175 by the infiltration process. As described above, the support 190 can comprise a ceramic or metal structure that is shaped to correspond to the shape of the base 175. The support 190 can be formed by a variety of methods, including for example, casting, isostatic pressing, or machining a block of metal or sintered ceramic material. The cavity 300 is formed in the base 175 by drilling, boring, or milling. For example, in a preferred embodiment shown in FIG. 7*c,* the support 190 is formed from two pieces of cast zirconium. A top member 190*a* comprises a right cylinder having a cavity 300 with an annular channel therein, and a lower plate 190*b* that covers the cavity 300. Optionally, the lower plate 190*b* can also be machined to provide the gas inlet 310*a* and the gas outlet 310*b* for supplying and exhausting heat transfer gas from the cavity 300 respectively. After forming the cavity 300, the top and bottom surfaces of the assembled support 190 are ground until the surface roughness of the support 190 is less than about 1 micron. Surface grinding is needed for the support 190 to uniformly contact the base 175 and to provide a strong and substantially void free bond layer 295 between the support 190 and the base 175. A smooth bottom surface is useful to enhance the vacuum seal between the support 190 and the bottom surface 50 of the chamber 25. After grinding, the support 190 is thoroughly cleaned to remove grinding debris. For those embodiments in which the support 190 comprises a metal, the exposed surfaces of the support 190 can be treated or coated with a material to reduce erosion or corrosion by the energized process gases. For example, the exposed surfaces of the support 190 can be anodized or coated with thermally sprayed alumina.

The following examples illustrate the thermal expansion compatibility of a variety of combinations of materials that can be used to form the electrostatic chuck 55, the base 175 and the support 190, or for bonding the electrostatic member 100 to a base 175 by the bond layer 250. The test coupons are scaled down to approximate the dimensions of an electrostatic chuck 55 and are made from the different materials bonded together by the infiltration process of the present invention. The silicon carbide and mullite materials were high porosity materials infiltrated with a compliant metal, such as aluminum. In the infiltration process, molten aluminum was infiltrated in a heated and pressurized vessel at a pressure of about 1030 kPa (150 psi) and a temperature of about 600° C.

In Examples 1 to 9, the surface flatness of the bonded test coupons was measured using a profilemeter to determine the degree and direction of bowing which measures the curvature of a surface from the center to a peripheral edge occurring due to a thermal expansion mismatch of two different materials bonded together. Positive bowing occurs when the center of a surface is higher relative to the peripheral edge, and negative bowing occurs when the peripheral edge is higher. It is desirable for the receiving surface 120 of the electrostatic chuck 55 to be flat to prevent breaking of a substrate held to the surface, and to reduce any non-uniformity in the heat transfer rates which occurs when one portion of the substrate 30 is closer to the electrostatic chuck 55 or to the source of the energized process gas. For example, a surface 120 having a diameter of about 200 mm should exhibit less than about 254 $\mu$m (10 mils) of bowing. Excessive bowing can also cause the dielectric 115, base 175, support 190, or the bond layers 250, 295 between them to crack reduce the operating life of the electrostatic chuck 55, or contaminate the chamber 25.

Referring to Table II, bonded test coupons sized 100 by 180 mm and having a thickness of 10 to 12 mm were repeatedly cycled between room temperature and a temperature of 300° C. or higher. Subsequent testing and examination demonstrate the ability of the metal-ceramic composite and the bond of the present invention to securely bond different materials with an acceptable level of bowing and microcracking.

TABLE II

| EXAMPLE NO. | MATERIALS BONDED | CTE MISMATCH | BONDING QUALITY |
|---|---|---|---|
| 1 | AlSiC to AlN | 6.9 to 5.5 | Excellent/positive bowing of less than about 10 mils. |
| 2 | AlSiC to Al$_2$O$_3$ | 6.9 to 7.1 | Excellent/positive bowing of less than about 6 mils. |
| 3 | AlSiC to Mullite | 6.9 to 7.9 | Excellent/No bowing, Mullite cracking |
| 4 | AlSiC to Ti alloys | 6.9 to 9.5 | Excellent/positive bowing |
| 5 | AlSiC to AlSiC | 6.9 to 6.9 | Excellent/No bowing |
| 6 | AlSiC to Metal (Mo, Ta, W, Kovar and Invar) | 6.9 to 6.0 | Excellent/No bowing |
| 7 | Al-SiSiC to AlN | 5.8 to 5.5 | Excellent/positive bowing of less than about 2 mils. |
| 8 | AlC to AlN | 4.8 to 5.5 | Excellent/negative bowing of less than about 3 mils. |
| 9 | AlC to AlC | 4.8 to 4.8 | Excellent/No bowing |

In this manner, the present invention provides a system for holding and supporting a substrate 30 that is capable of maintaining the substrate 30 in a narrow range of high temperatures. The substrate 30 is heated or cooled depending on the heat provided by the plasma and the optional heater 235. In addition, the electrostatic chuck 55, base 175, and support 190 can rapidly heat or cool the substrate 30 without fracturing or microcracking from thermal shock or thermal expansion stresses. Also, the present invention provides a reliable electrical connection between the electrical connector 140 and the electrode 105 of the electrostatic chuck 55.

Although the present invention has been described in considerable detail with regard to certain preferred versions thereof, other versions are possible. For example, the electrostatic chuck can be used to hold other substrates, such as flat panel displays, circuit boards, and liquid crystal displays as apparent to those skilled in the art and without deviating from the scope of the invention. Also, the electrostatic chuck of the present invention can be used in other environments, such as physical vapor deposition and chemical vapor deposition chambers. Therefore, the appended claims should not be limited to the description of the preferred versions contained herein.

What is claimed is:

1. An electrostatic chuck for holding a substrate, the electrostatic chuck comprising:

(a) an electrostatic member comprising a dielectric covering an electrode that is chargeable to electrostatically hold the substrate; and (b) a base below the electrostatic member, the base comprising a composite of ceramic and metal, and a heater.

2. An electrostatic chuck according to claim 1 wherein the heater comprises a resistive heating element composed of tungsten, molybdenum, iron, nickel, copper, Inconel or alloys thereof.

3. An electrostatic chuck according to claim 1 wherein the heater comprises a resistance sufficiently high to raise the temperature of a substrate held on the electrostatic member by at least about 100° C.

4. An electrostatic chuck according to claim 1 wherein the heater is substantially planar.

5. An electrostatic chuck according to claim 1 wherein the composite comprises a coefficient of thermal expansion within about ±30% of a coefficient of thermal expansion of the electrostatic member.

6. An electrostatic chuck according to claim 1 wherein the composite comprises porous ceramic infiltrated with metal.

7. An electrostatic chuck according to claim 1 wherein the electrostatic member and base comprise separate structures that are joined to one another.

8. An electrostatic chuck according to claim 7 wherein the electrostatic member and base are joined by a bond layer comprising a metal.

9. A method of fabricating an electrostatic chuck for holding a substrate, the method comprising:

(a) forming an electrostatic member comprising a dielectric covering an electrode that is chargeable to electrostatically hold the substrate; and (b) forming a base comprising a composite of ceramic and metal, a heater, and having a surface that can be joined to the electrostatic member.

10. A method according to claim 9 further comprising joining the electrostatic member to the base.

11. A method according to claim 9 further comprising joining the electrostatic member to the base by a bond layer comprising a metal.

12. A method according to claim 9 wherein (b) comprises forming the base by infiltrating a metal into a porous ceramic.

13. A method according to claim 12 wherein (b) comprises embedding a heater comprising a resistive heating element in the porous ceramic.

14. A method according to claim 12 comprising forming the porous ceramic by sintering one or more of aluminum oxide, aluminum nitride, boron carbide, carbon, cordierite, mullite, silicon carbide, silicon nitride, silicon dioxide and zirconium oxide.

15. A method according to claim 12 wherein (b) comprises infiltrating the porous ceramic with a metal comprising aluminum, copper, iron, molybdenum, titanium, tungsten or alloys thereof.

16. A method according to claim 9 wherein (b) comprises forming a heater comprising a resistance sufficiently high to be able to raise the temperature of a substrate held on the electrostatic member by at least about 100° C.

17. A method according to claim 9 wherein (b) comprises forming a heater that is substantially planar.

18. A method according to claim 9 wherein the electrostatic member and base comprise separate structures.

* * * * *